United States Patent
Sumi et al.

(10) Patent No.: US 10,600,951 B2
(45) Date of Patent: Mar. 24, 2020

(54) VIBRATING PLATE STRUCTURE AND PIEZOELECTRIC ELEMENT APPLICATION DEVICE

(71) Applicant: Seiko Epson Corporation, Tokyo (JP)

(72) Inventors: Koji Sumi, Shiojiri (JP); Eiji Osawa, Suwa (JP)

(73) Assignee: Seiko Epson Corporation (JP)

( * ) Notice: Subject to any disclaimer, the term of this patent is extended or adjusted under 35 U.S.C. 154(b) by 451 days.

(21) Appl. No.: 15/358,261

(22) Filed: Nov. 22, 2016

(65) Prior Publication Data

US 2017/0179368 A1    Jun. 22, 2017

(30) Foreign Application Priority Data

Dec. 21, 2015   (JP) .................................. 2015-249097

(51) Int. Cl.
*H01L 41/08*  (2006.01)
*B06B 1/06*   (2006.01)
(Continued)

(52) U.S. Cl.
CPC .......... *H01L 41/081* (2013.01); *B06B 1/0622* (2013.01); *B41J 2/14233* (2013.01);
(Continued)

(58) Field of Classification Search
CPC .. H01I 14/081; H01L 41/0973; B06B 1/0622; B41J 2002/14241; B41J 2002/14419; B41J 2002/14491; B41J 2202/03
(Continued)

(56) References Cited

U.S. PATENT DOCUMENTS 5,719,607 A   2/1998 Hasegawa et al.
5,933,167 A   8/1999 Shimada et al.
(Continued)

FOREIGN PATENT DOCUMENTS

JP   08-112896 A    5/1996
JP   H09-254386 A   9/1997
(Continued)

*Primary Examiner* — Thomas M Dougherty
(74) *Attorney, Agent, or Firm* — Harness, Dickey & Pierce, P.L.C.

(57) ABSTRACT

A vibrating plate is provided between a substrate and a piezoelectric element formed of electrodes and a piezoelectric layer and includes a first layer which is formed of a silicon oxide and a second layer which is formed of a ceramic having a Young's modulus larger than that of the silicon oxide. Under the condition in which the following expression (1) has a constant value, where in the expression (1), $E_{v1}$, $d_{v1}$, $E_{v2}$, and $d_{v2}$ represent Young's modulus of the first layer, the thickness thereof, Young's modulus of the second layer, and the thickness thereof, $$E_{v1} \times d_{v1}^2 + E_{v2} \times d_{v2}^2 \qquad (1)$$

when the combination of $d_{v1}$ and $d_{v2}$ which sets the value of the following expression (2) in a range of from the minimum value to +2% thereof is represented by ($D_{v1}$, $D_{v2}$), $$E_{v1} \times d_{v1}^3 + E_{v2} \times d_{v2}^3 \qquad (2)$$

the thickness of the first layer and the thickness of the second layer are represented by $D_{v1}$ and $D_{v2}$.

10 Claims, 12 Drawing Sheets

(51) Int. Cl.
*B41J 2/14* (2006.01)
*H01L 41/09* (2006.01)

(52) U.S. Cl.
CPC . *H01L 41/0973* (2013.01); *B41J 2002/14241* (2013.01); *B41J 2002/14419* (2013.01); *B41J 2002/14491* (2013.01); *B41J 2202/03* (2013.01)

(58) Field of Classification Search
USPC ........ 310/311, 324, 328, 330–332, 348, 365, 310/358
See application file for complete search history.

(56) References Cited

U.S. PATENT DOCUMENTS

| | | | |
|---|---|---|---|
| 6,505,919 | B1 | 1/2003 | Mizutani |
| 7,651,201 | B2 | 1/2010 | Shimada et al. |
| 2006/0203041 | A1 | 9/2006 | Shimada et al. |
| 2010/0157000 | A1 | 6/2010 | Sumi |
| 2013/0338507 | A1* | 12/2013 | Onishi ................. B06B 1/0622 600/459 |
| 2016/0027988 | A1* | 1/2016 | Nagahata ............ H01L 41/0472 347/70 |

FOREIGN PATENT DOCUMENTS

| | | |
|---|---|---|
| JP | 11-348280 A | 12/1999 |
| JP | 2000-062173 A | 2/2000 |
| JP | 2000-094688 A | 4/2000 |
| JP | 2001-146014 A | 5/2001 |
| JP | 2001-260348 A | 9/2001 |
| JP | 2004-195994 A | 7/2004 |
| JP | 2011-255024 A | 12/2011 |
| JP | 2011-259274 A | 12/2011 |
| JP | 2014-172295 A | 9/2014 |
| JP | 2016-004932 A | 1/2016 |

* cited by examiner

VIBRATING PLATE STRUCTURE AND PIEZOELECTRIC ELEMENT APPLICATION DEVICE

BACKGROUND

1. Technical Field

The present invention relates to a vibrating plate structure and a piezoelectric element application device.

2. Related Art

In general, a piezoelectric element includes a piezoelectric layer having electromechanical conversion characteristics and two electrodes which sandwich the piezoelectric layer. In recent years, development of a device (piezoelectric element application device) using as a drive source, the piezoelectric element as described above has been energetically carried out. As examples of the piezoelectric element application device, a liquid jetting head represented by an ink jet type recording head, a micro-electro-mechanical-system (MEMS) component represented by a piezoelectric MEMS element, an ultrasonic measurement device represented by an ultrasonic sensor or the like may be mentioned, and furthermore, a piezoelectric actuator device may also be mentioned by way of example.

In the piezoelectric element application device as described above, as a vibrating plate provided between a piezoelectric element and a substrate, for example, the structure in which a tantalum layer having a thickness of 110 nm or more is provided between a vibrating plate ($SiO_2$) having a thickness of 500 nm and a piezoelectric element has been disclosed (see JP-A-08-112896).

In addition, JP-A-2004-195994 and JP-A-09-254384 have disclosed the composition in which, for example, on a $SiO_2$ film having a thickness of 800 nm, a $ZrO_2$ layer having a thickness of 1,000 nm is provided.

SUMMARY

In the piezoelectric element application device as described above, the displacement caused by drive of the piezoelectric element is required to be improved. In the above patent documents, the vibrating plate composition has only been shown by way of example in the composition of each piezoelectric element, and the composition of the vibrating plate has not been investigated so as to maximize the displacement. That is, in order to improve the displacement, although the improvement in piezoelectric characteristics of a piezoelectric material forming the piezoelectric element has been, of course, carried out, a proposal on actual design and composition of the device has not been made at all through systematic investigation on the relationship between the thickness of the piezoelectric element including a piezoelectric layer and the thickness of a vibrating plate; the flexural rigidityes of the vibrating plate and the piezoelectric element; and the like.

In particular, in an ultrasonic sensor, besides the improvement in transmission efficiency, since the reception efficiency is also required to be improved, the above two efficiencies are required to be simultaneously improved; however, from this point of view, the vibrating plate structure has not been investigated.

In consideration of the situation as described above, an advantage of some aspects of the invention is to provide a vibrating plate structure capable of improving the displacement efficiency and a piezoelectric element application device.

A vibrating plate structure according to a first aspect of the invention comprises a vibrating plate provided between a substrate and a piezoelectric element formed of a pair of electrodes and a piezoelectric layer sandwiched therebetween, and the vibrating plate includes a first layer which is formed of a silicon oxide film and which is provided at a substrate side and a second layer which is formed of a ceramic having a Young's modulus larger than that of the silicon oxide.

In the above vibrating plate structure, under the condition in which the following expression (1) has a constant value, where in the expression (1), $E_{v1}$, $d_{v1}$, $E_{v2}$, and $d_{v2}$ represent Young's modulus of the first layer, the thickness thereof, Young's modulus of the second layer, and the thickness thereof, respectively, $$E_{v1} \times d_{v1}^2 + E_{v2} \times d_{v2}^2 \qquad (1)$$

when the combination of $d_{v1}$ and $d_{v2}$ which sets the value of the following expression (2) in a range of from the minimum value to +2% thereof is represented by ($D_{v1}$, $D_{v2}$), $$E_{v1} \times d_{v1}^3 + E_{v2} \times d_{v2}^3 \qquad (2)$$

the thickness of the first layer and the thickness of the second layer are represented by $D_{v1}$ and $D_{v2}$, respectively.

In the aspect described above, since the value of the expression (1) is maintained constant, while a neutral plane obtained when the piezoelectric element is driven is located at the boundary between the piezoelectric element and the vibrating plate or in the vicinity of the electrode of the piezoelectric element at a vibrating plate side, a vibrating plate is obtained which is formed of the first layer and the second layer having the thicknesses at which the second expression (2) has a value in the vicinity of the minimum value. Hence, the flexural rigidity of the vibrating plate is decreased, and the displacement efficiency is improved.

In this case, the thickness of the first layer is preferably 200 nm or more. Accordingly, the density of a silicon oxide film becomes preferable, and the mechanical strength thereof also becomes preferable.

In addition, the ceramic forming the second layer is preferably one type selected from the group consisting of zirconium oxide, aluminum oxide, silicon nitride, and silicon carbide. Accordingly, the neutral plane of the vibrating plate obtained when the piezoelectric element is driven is more reliably located at the boundary between the piezoelectric element and the vibrating plate or in the vicinity of the electrode of the piezoelectric element at the vibrating plate side.

A piezoelectric element application device according to another aspect of the invention comprises the vibrating plate structure described above and the piezoelectric element provided on the above vibrating plate.

In the aspect described above, while the neutral plane is located at the boundary between the piezoelectric element and the vibrating plate or in the vicinity of the electrode of the piezoelectric element at the vibrating plate side, the vibrating plate formed of the first layer and the second layer having the thicknesses at which the second expression (2) has a value in the vicinity of the minimum value is obtained, and hence, the flexural rigidity of the vibrating plate is decreased, and the displacement efficiency is improved.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
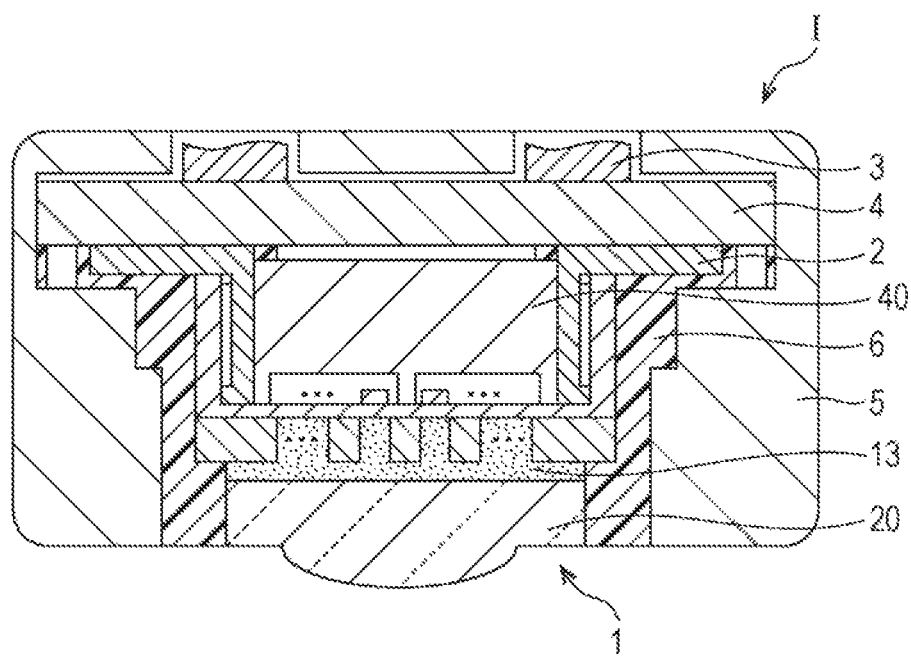
FIG. 1 is a cross-sectional view showing a composition example of an ultrasonic device.

Hereinafter, embodiments of the invention will be described with reference to the drawings. In the following description, some aspects of the invention are described, and modifications and changes may be arbitrarily performed without departing from the scope of the invention. In the drawings, members designated by the same reference numeral are equivalent to each other, and the description thereof is appropriately omitted.

Embodiment 1

Ultrasonic Device

FIG. 1 is a cross-sectional view showing a composition example of an ultrasonic device in which an ultrasonic sensor is mounted, and the ultrasonic sensor and the ultrasonic device are examples of a piezoelectric element application device. As shown in the drawing, an ultrasonic probe I is formed to have a CAV face type ultrasonic sensor 1, a flexible printed circuit substrate (FPC substrate 2) connected thereto, cables 3 extended from a device terminal (not shown), a relay substrate 4 connecting the FPC substrate 2 to the cables 3, a housing 5 protecting the ultrasonic sensor 1, the FPC substrate 2, and the relay substrate 4, a water resistant resin 6 filled between the housing 5 and the ultrasonic sensor 1, and the like.

An ultrasonic wave is transmitted from the ultrasonic sensor 1. In addition, an ultrasonic wave reflected by a measurement object is received by the ultrasonic sensor 1. In accordance with waveform signals of those ultrasonic waves, information (position, shape, and the like) on the measurement object is detected by the device terminal of the ultrasonic probe I.

According to the ultrasonic sensor 1, as described below, a structural strain is suppressed from being generated, and a high reliability can be secured. Hence, when the ultrasonic sensor 1 is mounted, an ultrasonic device excellent in various characteristics can be obtained. The invention can be applied to any ultrasonic sensors, such as a transmission exclusive type in which transmission of an ultrasonic wave is optimized, a reception exclusive type in which reception of an ultrasonic wave is optimized, and a transmission/reception integrated type in which transmission and reception of ultrasonic waves are both optimized. An ultrasonic device in which the ultrasonic sensor 1 can be mounted is not limited to the ultrasonic probe I.

Ultrasonic Sensor

Figure 2:
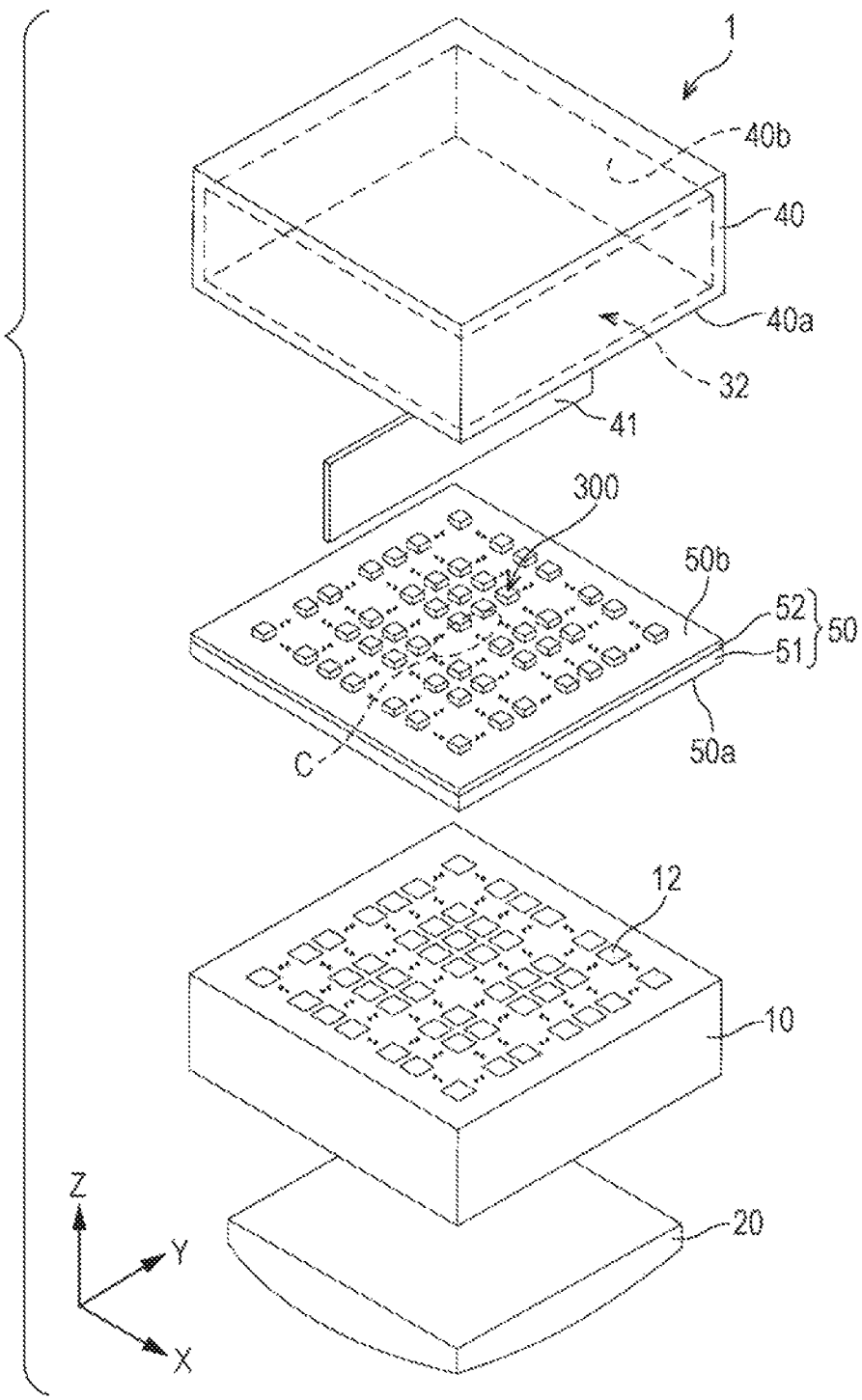
FIG. 2 is an exploded perspective view showing a composition example of an ultrasonic sensor.
Figure 3:
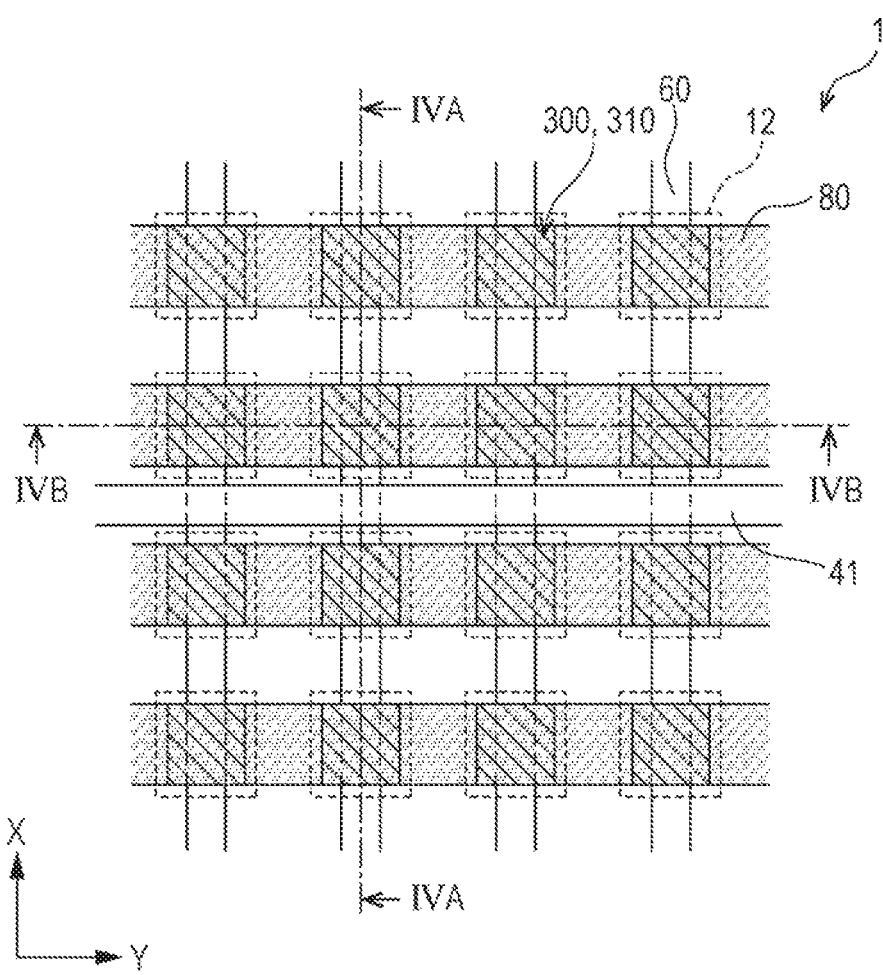
FIG. 3 is a plan view showing the composition example of the ultrasonic sensor.
Figure 4A:
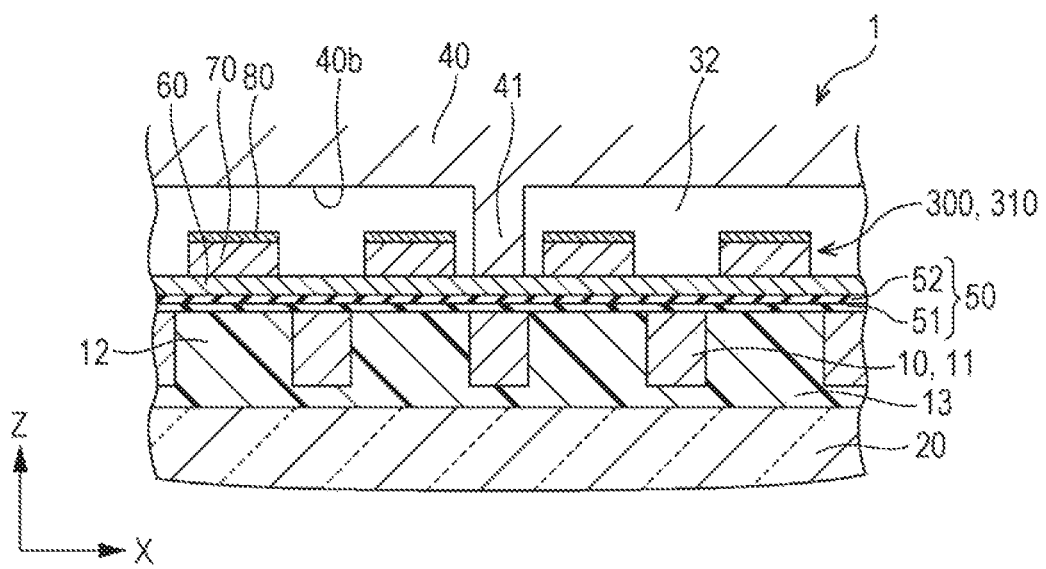
FIG. 4A is a cross-sectional view showing the composition example of the ultrasonic sensor.
Figure 4B:
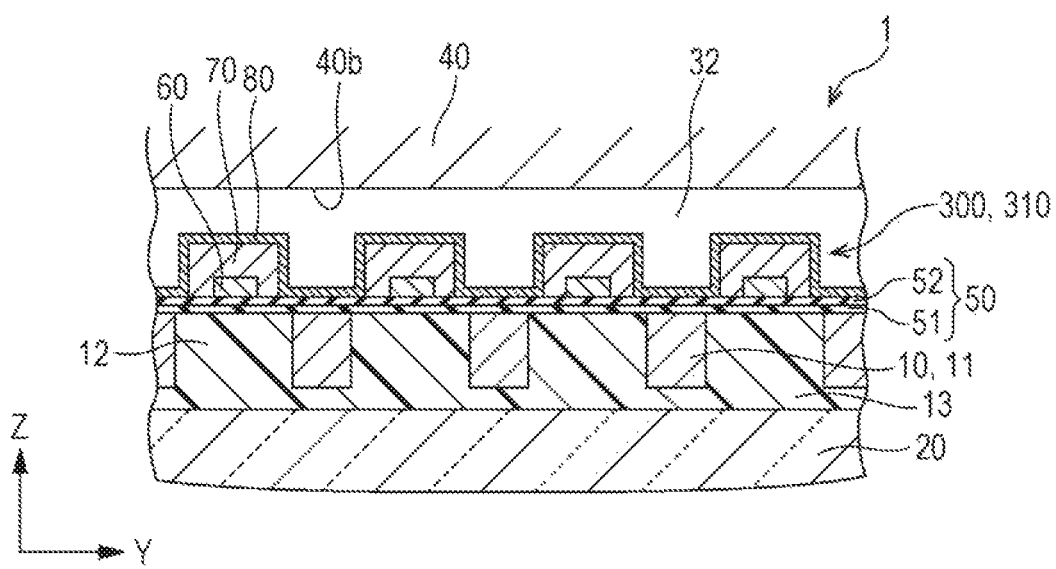
FIG. 4B is a cross-sectional view showing the composition example of the ultrasonic sensor.

Next, a composition example of the ultrasonic sensor 1 will be described. FIG. 2 is an exploded perspective view of the ultrasonic sensor. FIG. 3 is a plan view of a substrate of the ultrasonic sensor. FIG. 4A is a cross-sectional view taken along the line IVA-IVA of FIG. 3. FIG. 4B is a cross-sectional view taken along the line IVB-IVB of FIG. 3.

When the substrate of the ultrasonic sensor is along an XY plane formed by an X axis and a Y axis, the cross-section of FIG. 4A is along an XZ plane formed by the X axis and a Z axis, and the cross-section of FIG. 4B is along a YZ plane formed by the Y axis and the Z axis. Hereinafter, the X axis, the Y axis, and the Z axis are called a first direction X, a second direction Y, and a third direction Z, respectively.

The ultrasonic sensor 1 is formed to have an ultrasonic sensor element 310, an acoustic matching layer 13, a lens member 20, and a surrounding plate 40. The ultrasonic sensor element 310 is formed to have a substrate 10, a vibrating plate 50, and piezoelectric elements 300. In FIG. 2, although the surrounding plate 40 and a support member 41 are separately shown but are actually formed in an integrated manner.

In the substrate 10, a plurality of partitions 11 is formed. By the plurality of partitions 11, a plurality of spaces 12 is defined. The substrate 10 may be formed using a Si single crystal substrate. The substrate 10 is not limited to the above example, and for example, an SOI substrate or a glass substrate may also be used.

The space 12 is formed to penetrate the substrate 10 in the third direction Z. The spaces 12 are formed in a two-dimensional manner, that is, a plurality of spaces is formed in the first direction X, and a plurality of spaces is also formed in the second direction Y. When the first direction X is regarded as a scanning direction, and the second direction Y is regarded as a slicing direction, in the ultrasonic sensor 1, transmission/reception of ultrasonic waves are performed in each of lines extending in the slicing direction while scanning is performed in the scanning direction. Accordingly, sensing information along the slicing direction can be continuously obtained in the scanning direction. The space 12 has a regular tetragonal shape (the ratio of the length in the first direction X to that in the second direction Y is 1:1) when viewed in the third direction Z.

The arrangement of the spaces 12 and the shape thereof may be variously changed. The spaces 12 may be formed in a one-dimensional manner, that is, may be formed along any one of the first direction X and the second direction Y. In addition, the space 12 may have a rectangular shape (the ratio of the length in the first direction X to that in the second direction Y is other than 1:1) when viewed in the third direction Z.

The vibrating plate 50 is provided on the substrate 10 so as to block the spaces 12. Hereinafter, the surface of the vibrating plate 50 at a substrate 10 side is called a first surface 50a, and a surface facing this first surface 50a is called a second surface 50b. The vibrating plate 50 is formed to have an elastic film (first layer) 51 formed on the substrate 10 and an insulating layer (second layer) 52 formed on the elastic layer 51. In this embodiment, the surface of the elastic film 51 at a space 12 side is the first surface 50a, and the surface of the insulating layer 52 opposite to the space 12 is the second surface 50b.

The elastic film 51 is formed of silicon dioxide ($SiO_2$), the insulating film 52 is formed of a ceramic having a Young's modulus larger than that of silicon dioxide, and the ceramic is at least one type selected from the group consisting of zirconium oxide ($ZrO_2$), aluminum oxide ($Al_2O_3$), silicon nitride ($Si_3N_4$), and silicon carbide (SiC). Although the elastic film 51 is preferably formed in such a way that after the substrate 10 is formed from silicon, the silicon is thermally oxidized into silicon dioxide, the elastic film 51 may be formed from a material different from that of the substrate 10.

At a portion of the vibrating plate 50 corresponding to the space 12 at a second surface 50b side, a piezoelectric element 300 transmitting and/or receiving an ultrasonic wave is provided. Hereinafter, the portion of the vibrating plate 50 corresponding to the space 12 at the second surface 50b side is called a movable portion. The movable portion is a portion generating vibration by the displacement of the piezoelectric element 300. In accordance with the vibration generated in the movable portion, the ultrasonic sensor 1 transmits and/or receives an ultrasonic wave.

The piezoelectric element 300 is formed to have a first electrode 60 having a thickness of approximately 0.2 μm, a piezoelectric layer 70 having a thickness of approximately 3.0 μm or less and preferably having a thickness of approximately 0.5 to 1.5 μm, and a second electrode 80 having a thickness of approximately 0.05 μm.

Hereinafter, a portion sandwiched between the first electrode 60 and the second electrode 80 is called an active portion. In addition, in this embodiment, by the displacement of the piezoelectric layer 70, at least the vibrating plate 50 and the first electrode 60 are displaced. That is, in this embodiment, at least the vibrating plate 50 and the first electrode 60 substantially function as the vibrating plate. However, without providing one of the elastic film 51 and the insulating layer 52 or both of them, the first electrode 60 may only be configured so as to function as the vibrating plate. When the first electrode is directly provided on the substrate 10, the first electrode 60 is preferably protected by an insulating protective film or the like. However, in the case described above, compared to the vibrating plate composition of the present application, the displacement efficiency and the reception efficiency are both degraded.

Although not shown in the drawings, another layer may also be provided between the piezoelectric element 300 and the vibrating plate 50. For example, between the piezoelectric element 300 and the vibrating plate 50, an adhesion layer which improves the adhesion therebetween may be provided. The adhesion layer as described above may be formed, for example, of a titanium oxide ($TiO_x$) layer, a titanium (Ti) layer, or a silicon nitride (SiN) layer.

The piezoelectric element 300 is located in a region inside of the space 12 when viewed from the third direction Z. That is, the lengths of the piezoelectric element 300 in the first direction X and the second direction Y are smaller than the lengths of the space 12 in the first direction X and the second direction Y, respectively. However, the case in which the length of the piezoelectric element 300 in the first direction X is larger than the length of the space 12 in the first direction X or the case in which the length of the piezoelectric element 300 in the second direction Y is larger than the length of the space 12 in the second direction Y may also be included in the invention.

At the second surface 50b side of the vibrating plate 50, the surrounding plate 40 is provided. At a central portion of the surrounding plate 40, a recess portion (piezoelectric element holding portion 32) is formed. Along the periphery of this piezoelectric element holding portion 32, an edge portion 40a (see FIG. 1) of the surrounding plate 40 is formed. By the piezoelectric element holding portion 32, a region (region including the upper surfaces and the side surfaces of the piezoelectric elements 300) around the piezoelectric elements 300 is covered. Hence, a surface corresponding to the bottom surface of the piezoelectric element holding portion 32 is a surface 40b of the surrounding plate 40 at a piezoelectric element 300 side.

The surrounding plate 40 is bonded to an ultrasonic sensor element 310 side at the edge portion 40a. The bonding of the surrounding plate 40 may be performed using an adhesive (not shown) but is not limited thereto. The depth of the piezoelectric element holding portion 32, that is, the length thereof in the third direction Z, is approximately 80 μm but is not limited thereto. The depth of the piezoelectric element holding portion 32 may be set so as to secure a space in which the drive of the piezoelectric element 300 is not disturbed. In addition, the piezoelectric element holding portion 32 may be filled either with air or a resin. The thickness of the surrounding plate 40 is approximately 400 μm but is not limited thereto.

In the ultrasonic sensor 1, between the surface 40b of the surrounding plate 40 at the piezoelectric element 300 side and the second surface 50b of the vibrating plate 50, a support member 41 is provided at a position which is not overlapped with the piezoelectric elements 300. According to this composition, the vibrating plate 50 is supported by the support member 41. Hence, for example, when the lens member 20 is mounted, and/or the adhesion of the lens member 20 is secured after the lens member 20 is mounted, even if a predetermined pressure is applied to the vibrating plate 50 from an acoustic matching layer 13 side, the vibrating plate is prevented from being remarkably warped toward the piezoelectric element holding portion 32. As a result, the structural strain is suppressed from being generated, and a high reliability can be secured.

The support member 41 is provided at a position which is not overlapped with the piezoelectric elements 300. Hence, the piezoelectric element 300 is avoided from being excessively restrained by the support member 41. As a result, compared to the case in which no support member 41 is provided, the transmission efficiency and the reception efficiency of ultrasonic waves are prevented from being excessively degraded.

The position which is not overlapped with the piezoelectric elements 300 is a position which is not overlapped with the above active portions (each of which is sandwiched between the first electrode 60 and the second electrode 80) when viewed in the third direction Z. In particular, in the ultrasonic sensor 1, the support member having a width smaller than the thickness of the partition 11 is provided between adjacent spaces 12. That is, in the ultrasonic sensor 1, when viewed in the third direction Z, the support member 41 is not overlapped even with the above movable portion (portion of the vibrating plate 50 at the second surface 50b side which corresponds to the space 12). Hence, compared to the case in which no support member 41 is provided, the transmission efficiency and the reception efficiency of ultrasonic waves are reliably prevented from being excessively degraded. Although the support member 41 is bonded to the ultrasonic sensor element 310 side with an adhesive (not shown), a bonding method is not limited to the example described above.

The support member 41 has a beam shape extending along the second direction Y. By this support member 41, the vibrating plate 50 can be supported in a wide range along the second direction Y. The beam-shaped support member 41 may be extended in the first direction X instead of in the second direction Y. An extending end portion of the beam-shaped support member 41 may be apart from the edge portion 40a of the surrounding plate 40. As long as at least one extending end portion is in contact with the edge portion 40a of the surrounding plate 40, the function of the beam-shaped support member 41 is achieved.

The beam-shaped support member 41 is a member formed by performing wet etching on the surrounding plate 40. As described above, the support member 41 is formed using a constituent material of the surrounding plate 40 and has the same composition as that thereof. Although the wet etching is inferior to dry etching, for example, in terms of machining accuracy, a wide area can be etched in a short period of time; hence, in order to form the beam-shaped support member 41, wet etching is a preferable method.

The central portion of the piezoelectric element holding portion 32 is relatively apart from the edge portion 40a of the surrounding plate 40. Hence, in the vibrating plate 50, at a central position C (see FIG. 2) corresponding to the central portion of the piezoelectric element holding portion 32, the stiffness of the vibrating plate 50 is liable to be decreased when the no support member 41 is provided. Hence, the support member 41 is provided so as to support the central position C of the vibrating plate 50 as described above. As a result, a higher reliability can be secured.

In the invention, for example, the number, the arrangement, and the shape of the support member may be variously selected. For example, the number of the support members may be at least two. In this case, the support members are preferably provided in the piezoelectric element holding portion 32 with regular intervals. Accordingly, the vibrating plate 50 can be uniformly supported. Hence, the number of the support members is preferably an odd number of at least three. The reason for this is that when the support members are provided in the piezoelectric element holding portion 32 with regular intervals, a central support member can be located in the vicinity of the central position C of the vibrating plate 50. For example, when the number of the support members is three, a good balance can be obtained.

The support member may be provided only at a portion shifted from the central position C of the vibrating plate 50. The shape of the support member is not limited to a beam shape. The support member is not required to be linear in the extending direction. Depending on a method for forming the support member, although the cross-sectional area of the XY plane of the support member may be changed along the third direction Z in some cases, as long as the vibrating plate is supported, the support member in the above case is also included in the support member of the invention.

In the piezoelectric element 300, one of the electrodes is used as a common electrode, and the other electrode is used as a discrete electrode. In this embodiment, the first electrode 60 is provided along the first direction X to form the discrete electrode, and the second electrode 80 is provided along the second direction Y to form the common electrode. However, in consideration of the arrangement of drive circuits and wires, the first electrode may be formed as the common electrode, and the second electrode may be formed as the discrete electrode.

Materials of the first electrode 60 and the second electrode 80 are not particularly limited as long as having an electric conductivity. As the materials of the first electrode 60 and the second electrode 80, for example, a metal material, a tin oxide-based electrically conductive material, a zinc oxide-based electrically conductive material, or an oxide electrically conductive material may be mentioned. As the metal material, for example, there may be mentioned platinum (Pt), iridium (Ir), gold (Au), aluminum (Al), copper (Cu), titanium (Ti), or stainless steel. As the tin oxide-based electrically conductive material, for example, there may be mentioned indium tin oxide (ITO) or fluorine-doped tin oxide (PTO). As the oxide electrically conductive material, for example, there may be mentioned a zinc oxide-based electrically conductive material, strontium ruthenate (SrRuO$_3$), lanthanum nickelate (LaNiO$_3$), or an element-doped strontium titanate. The materials of the first electrode 60 and the second electrode 80 may also be an electrically conductive polymer.

The piezoelectric layer 70 is formed by patterning for each space 12 and is sandwiched between the above first electrode 60 and second electrode 80. The piezoelectric layer 70 is formed, for example, to contain a composite oxide having an ABO$_3$ type perovskite structure. As the composite oxide described above, for example, a titanate zirconate lead (Pb(Zr,Ti)O$_3$; PZT)-based composite oxide may be mentioned. According to this composite oxide, improvement in displacement of the piezoelectric element 300 can be easily performed. Of course, in the PZT-based composite oxide, another element may also be contained. As examples of the another element, for example, there may be mentioned lithium (Li), bismuth (Bi), barium (Ba), calcium (Ca), strontium (Sr), samarium (Sm), or cerium (Ce), each of which may substitute a part of the A site of the piezoelectric layer 70, or manganese (Mn), zinc (Zn), zirconium (Zr), magnesium (Mg), copper (Cu), aluminum (Al), nickel (Ni), cobalt (Co), chromium (Cr), titanium (Ti), or zirconium (Zr), each of which may substitute a part of the B site of the piezoelectric layer 70.

In addition, when a non-lead-based material in which the content of lead is decreased is used, the environmental load can be reduced. As the non-lead-based material, for example, a KNN-based composite oxide containing potassium (K), sodium (Na), and niobium (Nb) may be mentioned. In an example of the KNN-based composite oxide, K and Na are located in the A site, Nb is located in the B site, and the composition formula thereof is represented, for example, by (K,Na)NbO$_3$.

In the KNN-based composite oxide, another element may also be contained. As the another element, for example, there may be mentioned lithium (Li), bismuth (Bi), barium (Ba), calcium (Ca), strontium (Sr), samarium (Sm), or cerium (Ce), each of which may substitute a part of the A site of the piezoelectric layer 70, or manganese (Mn), zinc (Zn), zirconium (Zr), magnesium (Mg), copper (Cu), aluminum (Al), nickel (Ni), cobalt (Co), chromium (Cr), titanium (Ti), or zirconium (Zr), each of which may substitute a part of the B site of the piezoelectric layer 70.

Although the KNN-based composite oxide preferably contains no lead, as another element, Pb (lead) which substitutes a part of the A site may be contained. Examples of the another element are not limited to those mentioned above, and for example, tantalum (Ta), antimony (Sb), or silver (Ag) may also be mentioned. The another element may be contained alone, or at least two types thereof may also be contained. In general, the content of the another element is with respect to the total amount of elements each used as a primary component, 15% or less and preferably 10% or less. By the use of the another element, improvement in various characteristics and diversification of the composition and function may also be performed in some cases. In the case of a composite oxide using another element, the oxide is also preferably formed to have an $ABO_3$ perovskite structure.

As the non-lead-based material, besides the above KNN-based composite oxide, for example, a BFO-based composite oxide containing bismuth (Bi) and iron (Fe) or a BF-BT-based composite oxide containing bismuth (Bi), barium (Ba), iron (Fe), and titanium (Ti) may be mentioned. In an example using the BFO-based composite oxide, Bi is located at the A site, Fe and Ti are located at the B site, and the composition formula thereof is represented, for example, by $BiFeO_3$. In an example using the BF-BT-based composite oxide, Bi and Ba are located at the A site, Fe and Ti are located at the B site, and the composition formula thereof is represented, for example, by $(Bi,Ba)(Fe,Ti)O_3$.

In the BFO-based composite oxide and the BF-BT-based composite oxide, another element may also be contained. Examples of the another element are as described above. In addition, in the BFO-based composite oxide and the BF-BT-based composite oxide, an element forming a KNN-based composite oxide may also be contained.

In those composite oxides each having an $ABO_3$ perovskite structure, an oxide in which the composition is deviated from the stoichiometry due to deficiency and excess and an oxide in which at least one element is partially substituted by another element are also included. That is, as long as capable of having a perovskite structure, besides the composition inevitably deviated from the stoichiometry because of lattice mismatch, oxygen deficiency, and the like, for example, the composition in which the element is partially substituted by another element may also regarded as the above composite oxide.

The ultrasonic sensor element 310 is formed to include the spaces 12 formed in the substrate 10, the vibrating plate 50, and the piezoelectric elements 300. The acoustic matching layer 13 and the lens member 20 are provided for the ultrasonic sensor element 310 besides the above surrounding plate 40, so that the ultrasonic sensor 1 is formed.

The acoustic matching layer 13 is provided in the space 12. Since the acoustic matching layer 13 is provided, the acoustic impedance is prevented from being rapidly changed between the piezoelectric element 300 and a measurement object, and as a result, the propagation efficiency of an ultrasonic wave is prevented from being decreased. The acoustic matching layer 13 may be formed, for example, from a silicone resin but is not limited thereto, and a material may be appropriately selected and used, for example, in accordance with the application of the ultrasonic sensor.

The lens member 20 is provided on the substrate 10 at a side opposite to the vibrating plate 50. The lens member 20 functions to converge an ultrasonic wave. When an ultrasonic wave is not required to be converged, the lens member 20 may be omitted. In this embodiment, the above acoustic matching layer 13 also functions to adhere the lens member 20 to the substrate 10. The acoustic matching layer 13 is provided between the lens member 20 and the substrate 10 (partitions 11) to form the ultrasonic sensor 1.

When the lens member 20 is mounted on the ultrasonic sensor element 310, and/or when the adhesion of the lens member 20 is secured after the lens member 20 is mounted, the lens member 20 may be pushed to an acoustic matching layer 13 side in some cases. When the lens member is not provided, or when another member is provided instead of the lens member, in order to secure the adhesion of each portion, a pushing force may be applied to the vibrating plate 50 from the acoustic matching layer 13 side in some cases. Since the ultrasonic sensor 1 is formed to have the support member 41, even when a predetermined external force is applied to the vibrating plate 50 as described above, the structural strain is suppressed from being generated, and a high reliability can be secured.

In the ultrasonic sensor 1, one side of the vibrating plate 50 opposite to the piezoelectric element 300 is formed to have a CAV surface type to be used as a transmission region of an ultrasonic wave. As a result, since the composition in which moisture from the outside is extremely difficult to reach the piezoelectric element 300 can be realized, an ultrasonic sensor 1 excellent in in-use electric safety can be obtained. Furthermore, when the piezoelectric element 300 and the vibrating plate 50 are each thin, the edge portion 40a of the surrounding plate 40 and the support member 41, each of which has a sufficient thickness as compared to that of the vibrating plate 50, are bonded or adhered to the vibrating plate 50 so as to surround the piezoelectric elements 300. Hence, the handling properties in manufacturing can be improved, and the ultrasonic sensor 1 can be easily handled.

Figure 5A:
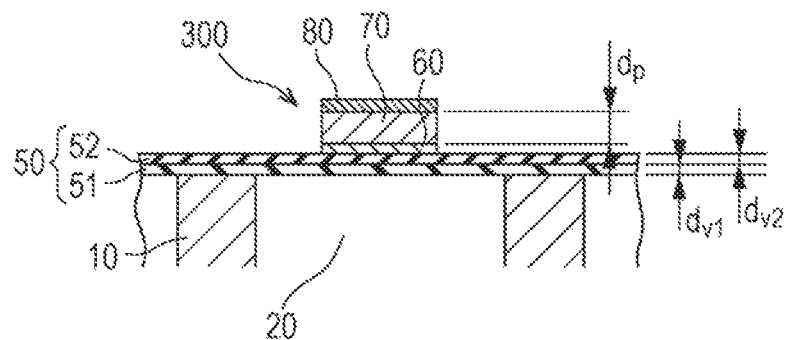
FIG. 5A is a schematic view showing the ultrasonic sensor in a normal state.

An important portion of the ultrasonic sensor 1 as described above is schematically shown in each of FIGS. 5A to 5C. FIG. 5A shows a normal state, FIG. 5B shows a state (transmission state) in which the piezoelectric element 300 is driven, and FIG. 5C shows a state (reception state) in which the piezoelectric element 300 is deformed upon reception of an ultrasonic wave.

Figure 5B:
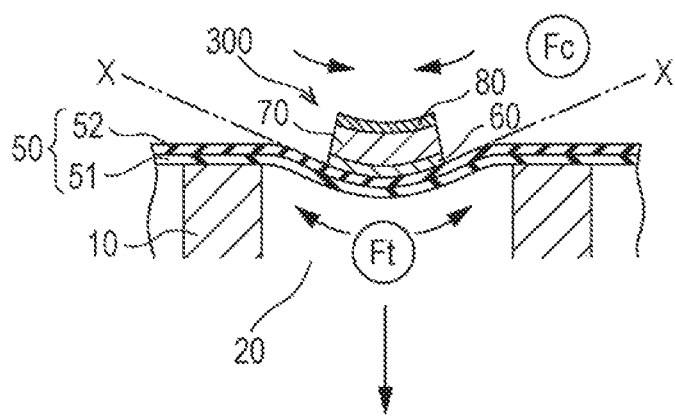
FIG. 5B is a schematic view showing the ultrasonic sensor in a transmission state.

When the piezoelectric element 300 is driven, as shown in FIG. 5B, a tensile stress Ft acts on the bottom surface of the vibrating plate 50, and a compressive stress Fc acts on the top surface of the second electrode 80. In FIG. 5C, the compressive stress Fc acts on the bottom surface of the vibrating plate 50, and the tensile stress Ft acts on the top surface of the second electrode 80. Accordingly, in the entire film including the piezoelectric element and the vibrating plate, a stress distribution is present in which from the surface of the second electrode to the bottom surface of the vibrating plate, the compressive stress is changed to the tensile stress (see FIG. 5B), or the tensile stress is changed to the compressive stress (see FIG. 5C). That is, in the film including the piezoelectric element and the vibrating plate, an X-X plane on which no stress is applied is present, and this plane is called a stress neutral plane.

The vibrating plate 50 is warped by deformation of the piezoelectric layer 70 when a voltage is applied thereto. When a voltage is applied to a lateral effect actuator, the piezoelectric layer 70 is contracted in an in-plane direction (direction orthogonal to the electric field). In order to maximally use the force of the deformation of the piezoelectric layer 70, the stress neutral plane is preferably not present in the piezoelectric layer 70, that is, for example, the stress neutral plane is preferably present in the first electrode 60. The reason for this is that for example, in FIG. 5B, if the neutral plane (X-X plane) is present in the piezoelectric layer 70, a portion at the lower side (tensile side) than the neutral plane (X-X plane) has no contribution to the deformation and furthermore, also functions to disturb the deformation. Ideally, when the first electrode 60 is formed to have the same width as that of the piezoelectric layer 70, the neutral plane is preferably present at the boundary between the first electrode 60 and the vibrating plate 50 but may also be present in the first electrode 60. In addition, when the first electrode 60 is extended as is the vibrating plate 50, the neutral plane is preferably present at the boundary between the first electrode 60 and the piezoelectric layer 70 but may also be present in the first electrode 60.

Figure 5C:
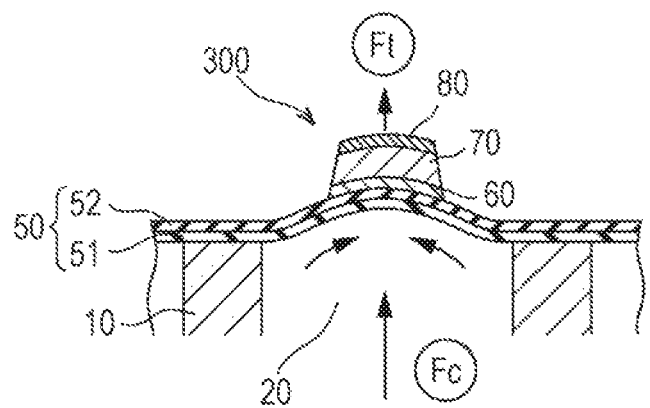
FIG. 5C is a schematic view showing the ultrasonic sensor in a reception state.

In the models shown in FIGS. 5A to 5C, the displacement efficiency will be studied. When the displacement in a non-load state is represented by a non-load displacement $D_0$, a force required to return the piezoelectric layer 70 in the state of this non-load displacement $D_0$ to the original state is represented by a generation force $F_0$, an actual displacement is represented by an actual displacement $D_1$, and a force required to return this state to the original state is represented by an actual generation force $F_1$, a displacement efficiency η is represented by the following formula (a) and is generally believed to be approximately 50%.

$$\text{Displacement efficiency } \eta = D_1/D_0 \tag{a}$$

In this case, the vibrating plate 50 is displaced when the piezoelectric layer 70 is bent. In addition, the displacement is proportional to the flexural rigidity of the piezoelectric layer 70. Furthermore, since disturbing the bending of the piezoelectric layer 70, the flexural rigidity of the vibrating plate 50 itself functions to disturb the displacement and corresponds to the load described above. In consideration of those described above, when the "actual displacement $D_1$" of the formula of the displacement efficiency η is replaced by "flexural rigidity $S_p$ of the piezoelectric layer 70-flexural rigidity $S_v$ of the vibrating plate 50", and the "non-load displacement $D_0$" is replaced by "flexural rigidity $S_p$ of the piezoelectric layer 70", the following formula (b) is obtained.

$$\text{Displacement efficiency (alternative value) } \eta' = (S_p - S_v)/S_p \tag{b}$$

$S_p$: Flexural rigidity of piezoelectric layer, Sy: Flexural rigidity of vibrating plate The flexural rigidity is represented by the product of Young's modulus and the moment of inertia of area. When the formula (b) is replaced by this product, the following formula is obtained.

$$\text{Displacement efficiency (alternative value)} \eta' = (E_p \times I_p - E_v \times I_v)/E_p \times I_p \tag{c}$$

$E_p$: Young's modulus of piezoelectric layer, $I_p$: Moment of inertia of area of piezoelectric layer, $E_v$: Young's modulus of vibrating plate, $I_v$: Moment of inertial of area of vibrating plate Furthermore, as for the ultrasonic sensor element, the moment of inertia of area is represented by the following formulas (d-1) and (d-2). That is, the moment of inertia of area is proportional to the cube of the thickness.

$$I_p = w \times d_p^3/12 \tag{d-1}$$

$$I_v = w \times d_v^3/12 \tag{d-2}$$

w: Cavity (space) length $d_p$: Thickness of piezoelectric layer, $d_v$: Thickness of vibrating plate When the formulas (d-1) and (d-2) are applied to the formula (c), the following formula (e) is obtained.

$$\text{Displacement efficiency (alternative value) } \eta' = (E_p \times d_p^3 - E_v \times d_v^3)/E_p \times d_p^3 \tag{e}$$

As shown in the formula (e), the flexural rigidity of the vibrating plate is proportional to the cube of the thickness.

In this case, at the stress neutral plane (X-X plane) described above, the tensile moment and the compressive moment are balanced to each other. When the stress neutral plane is set at a boundary portion (for example, approximately at the first electrode) between the piezoelectric layer and the vibrating plate, by the balance in moment, the relationship represented by the following formula (f) is obtained.

$$E_p \times d_p^2 = E_v \times d_v^2 \tag{f}$$

$E_p$: Young's modulus of piezoelectric layer, $d_p$: Thickness of piezoelectric layer, $E_v$: Young's modulus of vibrating plate, $d_v$: Thickness of vibrating plate As the case of the invention, when the vibrating plate is formed of a laminate including two layers, a first layer and a second layer, which are formed of different materials from each other, the moment of the entire vibrating plate is the sum of the moment of each layer, and the relationship represented by the formula (g) is obtained.

$$E_p \times d_p^2 = E_{v1} \times d_{v1}^2 + E_{v2} \times d_{v2}^2 \tag{g}$$

$E_p$: Young's modulus of piezoelectric layer, $d_p$: Thickness of piezoelectric layer, $E_{v1}$: Young's modulus of vibrating plate (first layer), $d_{v1}$: Thickness of vibrating plate (first layer)

$E_{v2}$: Young's modulus of vibrating plate (second layer), $d_{v2}$: Thickness of vibrating plate (second layer)

In this case, although the displacement may be increased when the thickness of the piezoelectric layer 70 is increased, when the position of the neutral plane is shifted, the number of the factors disturbing the displacement may be increased in some cases. Hence, the position of the neutral plane is at least required to be maintained (not shifted). In addition, for this purpose, when the thickness of the vibrating plate is increased, the flexural rigidity thereof is increased, and the displacement may be disturbed thereby in some cases; hence, the flexural rigidity of the vibrating plate is required to be set small.

As described above, in order to improve the transmission characteristics, the flexural rigidity of the vibrating plate is required to be minimized while the neutral plane in drive is maintained. The condition described above is required for improvement in displacement efficiency in a liquid jetting head.

In addition, in the ultrasonic sensor, the reception characteristics tend to be insufficient. Although the reception characteristics depend on an electromotive voltage or a generated charge generated by a strain produced in the piezoelectric layer upon application of a stress from the outside, in order to improve the reception characteristics, when a piezoelectric material is not changed, the thickness of the piezoelectric layer may be increased. However, in order to efficiently produce a stress in the piezoelectric layer in response to an external stress at the same level, the stress neutral plane is required to be located at an outer side of the piezoelectric layer, that is, at a first electrode side. Hence, in order to improve the reception efficiency, the position of the stress neutral plane is required not to be shifted.

As described above, in order to improve the reception characteristics, while the position of the stress neutral plane is maintained, the thickness of the piezoelectric layer is increased as much as possible. In addition, although the condition described above is enough for the composition exclusively used for reception, in order to improve both the transmission and reception characteristics, the flexural rigidity of the vibrating plate is also required to be decreased.

In this case, "the position of the stress neutral plane is maintained" indicates that "the value of the left term of each of the formulas (f) and (g) is maintained equal to the value of the right term thereof". For example, when the thickness of the piezoelectric layer is increased in order to improve the displacement, the value of the left term is increased. The values of the left term and the right term each correspond to a force (sum of stress) acting on a lateral cross-section (plane on which a stress is applied) of each film. Hence, when the value of the left term is increased, in order to make the value of the right term equal to the value of the left term, it is required to increase Young's modulus of the film forming the vibrating plate, to increase the thickness thereof, or to implement both of those described above.

When the thickness of the piezoelectric layer is increased in order to improve the displacement, the value of the left term of each of the formulas (f) and (g) is increased. In order to maintain the position of the stress neutral plane, of course, the value of the right term is also required to be increased. In addition, the value of the right term corresponds to the thickness of the piezoelectric layer at a ratio of 1:1 and is uniquely determined. In order to increase the value of the right term, it is required to increase Young's modulus of the film forming the vibrating plate, to increase the thickness thereof, or to implement both of those described above. This indicates that the flexural rigidity of the vibrating plate, that is, the resistance against the piezoelectric function, is increased. However, depending on the method of selecting Young's modulus and the thickness, without changing the value of each of the formulas (f) and (g), the flexural rigidity Sv of the vibrating plate can be set to the minimum value. In other words, when the thickness of the vibrating plate is changed, without shifting the position of the stress neutral plane, the flexural rigidity of the vibrating plate, which is the factor disturbing the displacement, can be minimized.

The mechanism in which without changing the value of the formula (f) or (g), the stiffness of the vibrating plate is minimized is as follows. The formula (f) or (g) indicates the value obtained by multiplying Young's modulus by the square of the thickness. Hence, the combination of Young's modulus and the thickness without changing the value of the formula may be arbitrarily present. When Young's modulus is increased, the thickness can be set to be small. In this case, the stiffness obtained by multiplying Young's modulus by the cube of the thickness is decreased. The reason for this is that the contribution of the thickness to the stiffness, which corresponds to the cube of the thickness, is larger than the contribution of Young's modulus.

In this case, when the ultrasonic sensor element is formed to have a vibrating plate and a piezoelectric element on a silicon substrate, in order to secure the insulating properties and to respond requests on manufacturing, a $SiO_2$ layer is substantially essential as the vibrating plate. The $SiO_2$ layer is not preferably replaced by a layer having a larger Young's modulus. Hence, in the invention, the vibrating plate is formed of a laminate including $SiO_2$ (first layer) and a ceramic (second layer) having a larger Young's modulus than that thereof so that Young's modulus of the entire vibrating plate is relatively increased, and the influence of the increase in flexural rigidity of the vibrating plate caused by the increase in thickness thereof is suppressed.

By the composition as described above, the reception characteristics and the transmission characteristics can both be improved, and as a result, an ultrasonic sensor having excellent transmission/reception characteristics can be obtained.

Young's modulus of $SiO_2$ is 72 to 74 GPa. As a ceramic having a Young's modulus larger than that of $SiO_2$, for example, the following materials may be mentioned.

$ZrO_2$: Young's modulus: 150 GPa
$Si_3N_4$: Young's modulus: 290 GPa
$Al_2O_3$: Young's modulus: 370 GPa
SiC: Young's modulus: 430 GPa Incidentally, a vibrating plate formed of a laminate including $SiO_2$ and $ZrO_2$ has been known. However, Young's modulus of $ZrO_2$ is approximately 150 GPa and is approximately only two times that of $SiO_2$. From the above formula (g), when the thickness of the piezoelectric layer is increased, since the value of the left term of the formula (f) is increased by the square of the difference in thickness, in order to secure the balance in consideration of the above increase due to the difference in thickness, the thickness of $ZrO_2$ is required to be increased to some extent. In order to improve both the transmission/reception characteristics, the flexural rigidity of the vibrating plate is required to be decreased. Hence, when the vibrating plate formed of a laminate including $SiO_2$ and $ZrO_2$ is used, as described below, unlike a related known vibrating plate formed of a laminate including $SiO_2$ and $ZrO_2$, the above condition may be satisfied in a range in which the ratio of the thickness of $ZrO_2$ is high.

On the other hand, as described above, when the thickness of the piezoelectric layer is increased, since the value of the left term of the formula (f) is increased by the square of the difference in thickness, in order to secure the balance in consideration of the above increase due to the difference in thickness, a material having a sufficiently high Young's modulus is preferably used for the second layer of the vibration plate as described above. Hence, from the point described above, as the second layer, instead of $ZrO_2$, another material having a Young's modulus of 290 GPa or more is preferably used.

From the discussion described above, the composition of the vibrating plate structure of the invention may be summarized as follows.

(1) First, the vibrating plate is formed of a laminate including $SiO_2$ (first layer) and a ceramic (second layer) having a Young's modulus larger than that of $SiO_2$. By the composition described above, Young's modulus of the entire vibrating plate is relatively increased, and the influence of the increase in flexural rigidity of the vibrating plate caused by the increase in thickness thereof is suppressed.

(2) Next, "the stress neutral plane is maintained", that is, when the thickness of the piezoelectric layer is changed, the value of the left term of the formula (g) is set equal to the value of the right term thereof, and in other words, the following expression (1), which is the right term of the formula (g), is set constant at a value corresponding to the thickness of the piezoelectric layer.

$$E_{v1} \times d_{v1}^2 + E_{v2} \times d_{v2}^2 \qquad (1)$$

(3) Furthermore, under the conditions described above, the flexural rigidity of the vibrating plate is minimized.

In this case, as described above, since the flexural rigidity of the vibrating plate is represented by the product of Young's modulus and the moment of inertia of area, and the moment of inertia of area is represented by the above formulas (d-1) and (d-2), the flexural rigidity of the vibrating plate formed of the laminate is represented by the following expression (2).

$$E_{v1} \times d_{v1}^3 + E_{v2} \times d_{v2}^3 \qquad (2)$$

Accordingly, in the vibrating plate structure of the invention, it is preferable that the conditions (1) and (2) are satisfied, and furthermore, the above expression (2) is minimized.

In this case, under the condition in which the value of the above expression (1) can be set constant, since the combination of $d_{v1}$ and $d_{v2}$ which minimizes the value of the above expression (2) is uniquely determined, when the combination of $d_{v1}$ and $d_{v2}$ which sets the value of the expression (2) in a range of from the minimum value to +2% thereof is represented by ($D_{v1}$, $D_{v2}$), the thickness of the first layer and the thickness of the second layer may be represented by $D_{v1}$ and $D_{v2}$, respectively.

Variation in displacement directly relates to variation of the transmission characteristics and the reception characteristics. In particular, in the case of a liquid ejection head which directly relates to the transmission characteristics, the range of variation in displacement is equal to the range of variation in ejection volume of a liquid particle or an ink droplet. The displacement, in other words, the range of variation in displacement efficiency is required to at least satisfy the specification for a liquid ejection head. The variation in volume of an ink droplet or the like ejected from a liquid jetting head is preferably set in a range of ±2%. That is, the range of variation in displacement efficiency is preferably set in a range of from the maximum value to −2% thereof. Since the stiffness of the vibrating plate is set so as to be minimized, the range of a relative stiffness of the vibrating plate that should be actually controlled is from the minimum value to +2% thereof.

A film forming the vibrating plate is effectively manufactured by a general sputtering machine in terms of cost reduction. Although the thickness of the film formed by a sputtering machine is varied depending on film formation conditions, the variation in thickness can be controlled within ±2%. When the variation in thickness is controlled within ±2%, the variation in flexural rigidity of the vibrating plate can be controlled within ±10%. By the manufacturing conditions described above, the relative stiffness of the vibrating plate can be controlled in a range of from the minimum value to +2% thereof, that is, the displacement efficiency can be controlled in a range of from the maximum value to −2% thereof.

EXAMPLES

Example 1

Figure 6A:
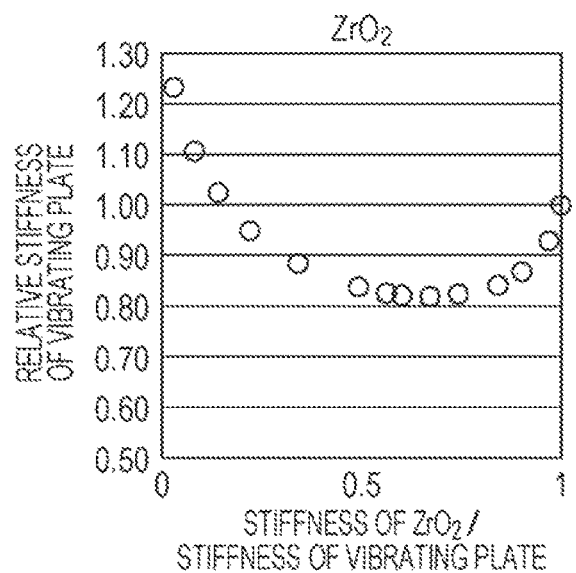
FIG. 6A is a graph showing results of Example 1.
Figure 6B:
FIG. 6B is a graph showing results of Example 1.

FIGS. 6A and 6B each show the relationship between the ratio (hereinafter, referred to as "stiffness ratio") of the flexural rigidity of $ZrO_2$ to the flexural rigidity of the entire vibrating plate and a relative value of the flexural rigidity of the vibrating plate. The above relationship was measured in such a way that after the piezoelectric layer was formed from PZT, and the vibrating plate was formed from $SiO_2$ and $ZrO_2$, while the value of the expression (1) uniquely determined depending on the thickness of the piezoelectric layer was maintained constant, the thickness dp of the piezoelectric layer was changed from 500 to 1,500 nm so as to change the thicknesses $d_{v1}$ of the first layer and the thickness $d_{v2}$ of the second layer of the vibrating plate. In this case, the relative value of the flexural rigidity is a relative value obtained when the flexural rigidity of the entire vibrating plate which is formed of a ceramic other than $SiO_2$ is assumed to be 1. A range in which the relative flexural rigidity is from the minimum value to +2% thereof is the range of the invention and is indicated by an arrow in the graph. In particular, the stiffness ratio was 0.63 to 0.77.

Figure 6C:
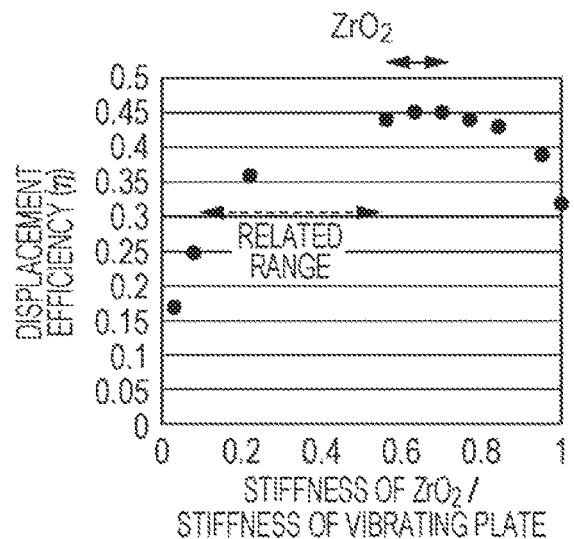
FIG. 6C is a graph showing results of Example 1.

In addition, FIG. 6C shows the relationship between the displacement efficiency η (in this case, the actual displacement is shown but is represented by η) and the stiffness ratio. In FIG. 6C, although a range of 0.11 to 0.51 which is a stiffness ratio of a vibrating plate of a laminate formed of $SiO_2$ and $ZrO_2$ is shown by a dotted arrow as a related technique, since the range of the invention is 0.63 to 0.77 as described above, it is understood that the technique of the invention is different from the above related technique. In addition, it is apparent that compared to the related technique, by the composition of the invention, the displacement efficiency is improved.

Example 2

Figure 7A:
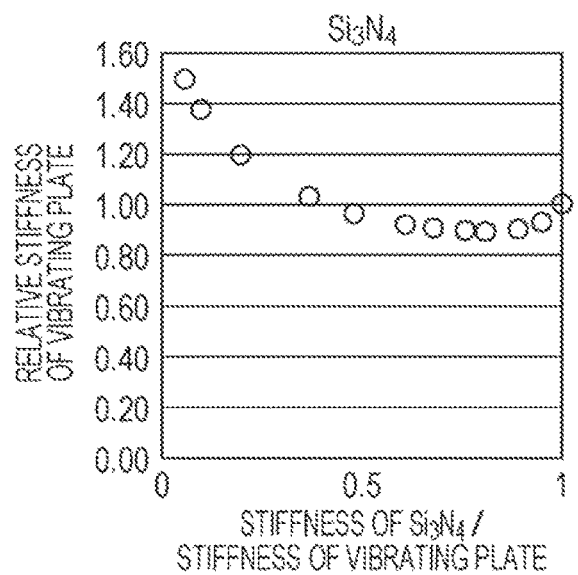
FIG. 7A is a graph showing results of Example 2.
Figure 7B:
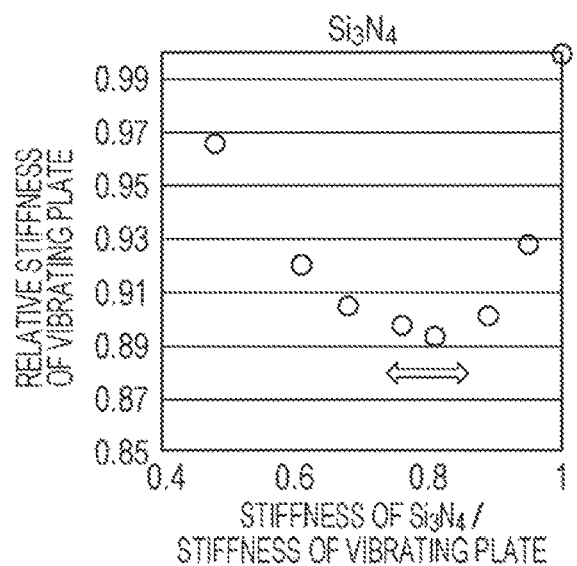
FIG. 7B is a graph showing results of Example 2.

FIGS. 7A and 7B each show the relationship between the ratio (hereinafter, referred to as "stiffness ratio") of the flexural rigidity of $Si_3N_4$ to the flexural rigidity of the entire vibrating plate and a relative value of the flexural rigidity of the vibrating plate. The above relationship was measured in such a way that after the piezoelectric layer was formed from PZT, and the vibrating plate was formed from $SiO_2$ and $Si_3N_4$, while the value of the expression (1) uniquely determined depending on the thickness of the piezoelectric layer was maintained constant, the thickness dp of the piezoelectric layer was changed from 500 to 1,500 nm so as to change the thicknesses $d_{v1}$ of the first layer and the thickness $d_{v2}$ of the second layer of the vibrating plate. In this case, the relative value of the flexural rigidity is a relative value obtained when the flexural rigidity of the entire vibrating plate which is formed of a ceramic other than $SiO_2$ is assumed to be 1. A range in which the relative flexural rigidity is from the minimum value to +2% thereof is the range of the invention and is indicated by an arrow in the graph. In particular, the stiffness ratio was 0.73 to 0.89.

Figure 7C:
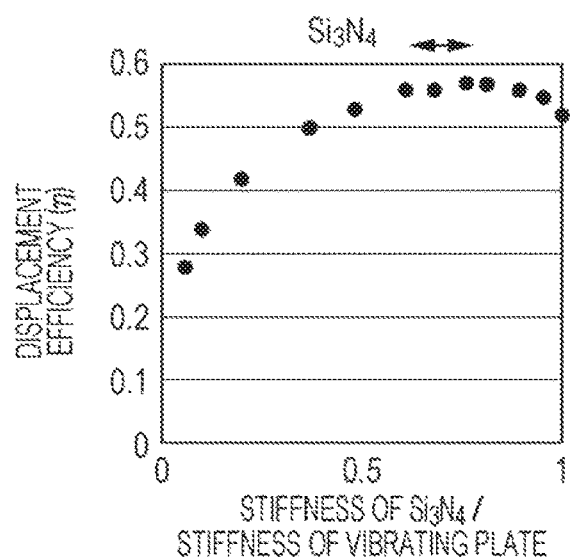
FIG. 7C is a graph showing results of Example 2.

In addition, FIG. 7C shows the relationship between the displacement efficiency η (in this case, the actual displacement is shown but is represented by η) and the stiffness ratio.

Example 3

Figure 8A:
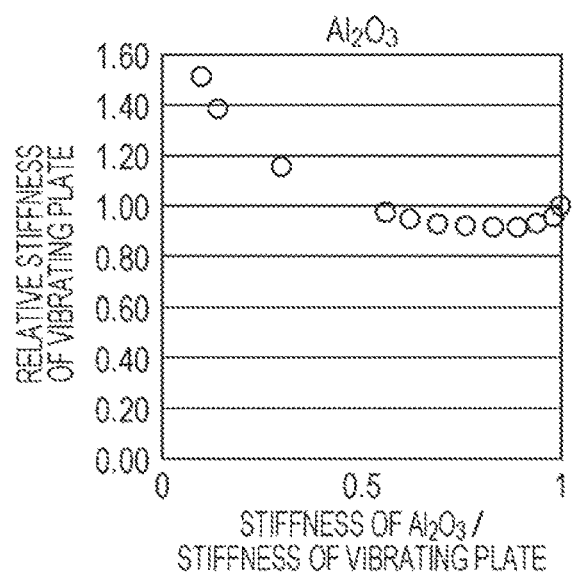
FIG. 8A is a graph showing results of Example 3.
Figure 8B:
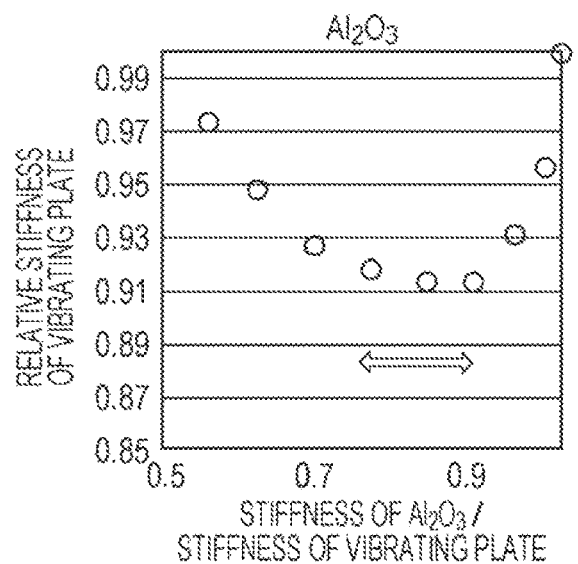
FIG. 8B is a graph showing results of Example 3.

FIGS. 8A and 8B each show the relationship between the ratio (hereinafter, referred to as "stiffness ratio") of the flexural rigidity of $Al_2O_3$ to the flexural rigidity of the entire vibrating plate and a relative value of the flexural rigidity of the vibrating plate. The above relationship was measured in such a way that after the piezoelectric layer was formed from PZT, and the vibrating plate was formed from $SiO_2$ and $Al_2O_3$, while the value of the expression (1) uniquely determined depending on the thickness of the piezoelectric layer was maintained constant, the thickness dp of the piezoelectric layer was changed from 500 to 1,500 nm so as to change the thicknesses $d_{v1}$ of the first layer and the thickness $d_{v2}$ of the second layer of the vibrating plate. In this case, the relative value of the flexural rigidity is a relative value obtained when the flexural rigidity of the entire vibrating plate which is formed of a ceramic other than $SiO_2$ is assumed to be 1. A range in which the relative flexural rigidity is from the minimum value to +2% thereof is the range of the invention and is indicated by an arrow in the graph. In particular, the stiffness ratio was 0.75 to 0.91.

Figure 8C:
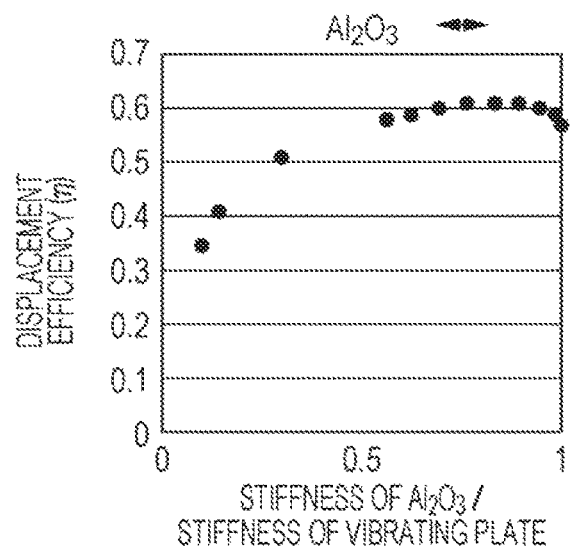
FIG. 8C is a graph showing results of Example 3.

In addition, FIG. 8C shows the relationship between the displacement efficiency η (in this case, the actual displacement is shown but is represented by η) and the stiffness ratio.

Example 4

Figure 9A:
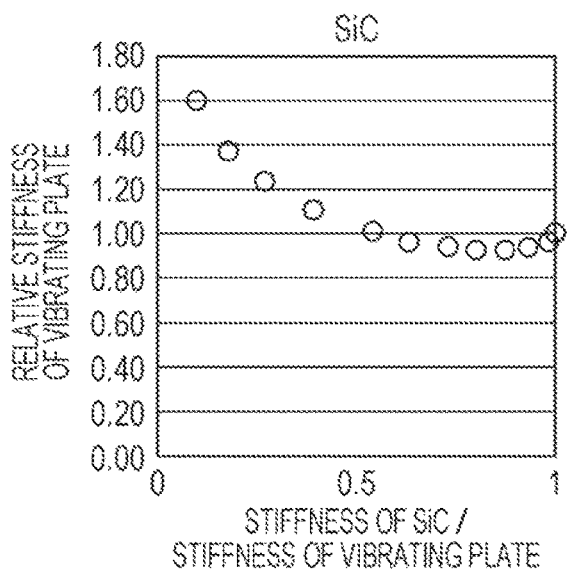
FIG. 9A is a graph showing results of Example 4.
Figure 9B:
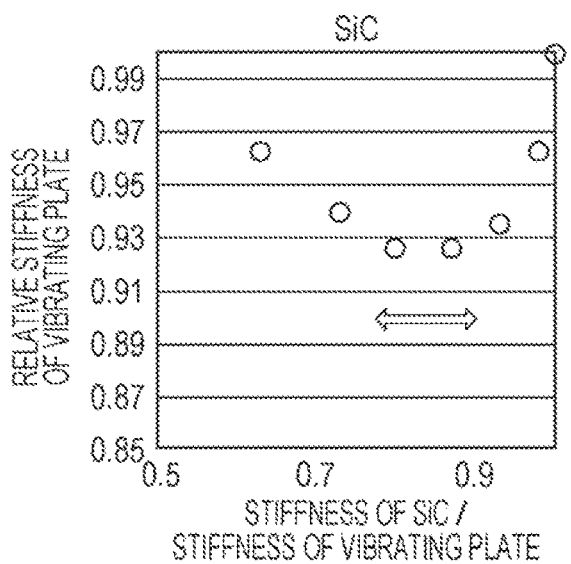
FIG. 9B is a graph showing results of Example 4.

FIGS. 9A and 9B each show the relationship between the ratio (hereinafter, referred to as "stiffness ratio") of the flexural rigidity of SiC to the flexural rigidity of the entire vibrating plate and a relative value of the flexural rigidity of the vibrating plate. The above relationship was measured in such a way that after the piezoelectric layer was formed from PZT, and the vibrating plate was formed from $SiO_2$ and SiC, while the value of the expression (1) uniquely determined depending on the thickness of the piezoelectric layer was maintained constant, the thickness dp of the piezoelectric layer was changed from 500 to 1,500 nm so as to change the thicknesses $d_{v1}$ of the first layer and the thickness $d_{v2}$ of the second layer of the vibrating plate. In this case, the relative value of the flexural rigidity is a relative value obtained when the flexural rigidity of the entire vibrating plate which is formed of a ceramic other than $SiO_2$ is assumed to be 1. A range in which the relative flexural rigidity is from the minimum value to +2% thereof is the range of the invention and is indicated by an arrow in the graph. In particular, the stiffness ratio was 0.76 to 0.92.

Figure 9C:
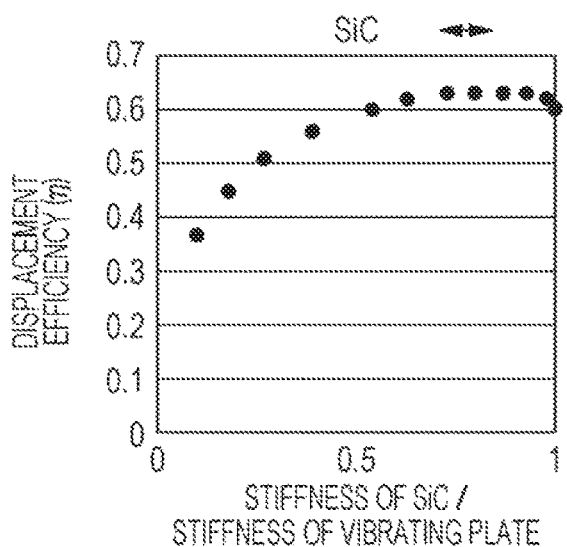
FIG. 9C is a graph showing results of Example 4.

In addition, FIG. 9C shows the relationship between the displacement efficiency η (in this case, the actual displacement is shown but is represented by η) and the stiffness ratio.

Embodiment 2

Figure 10:
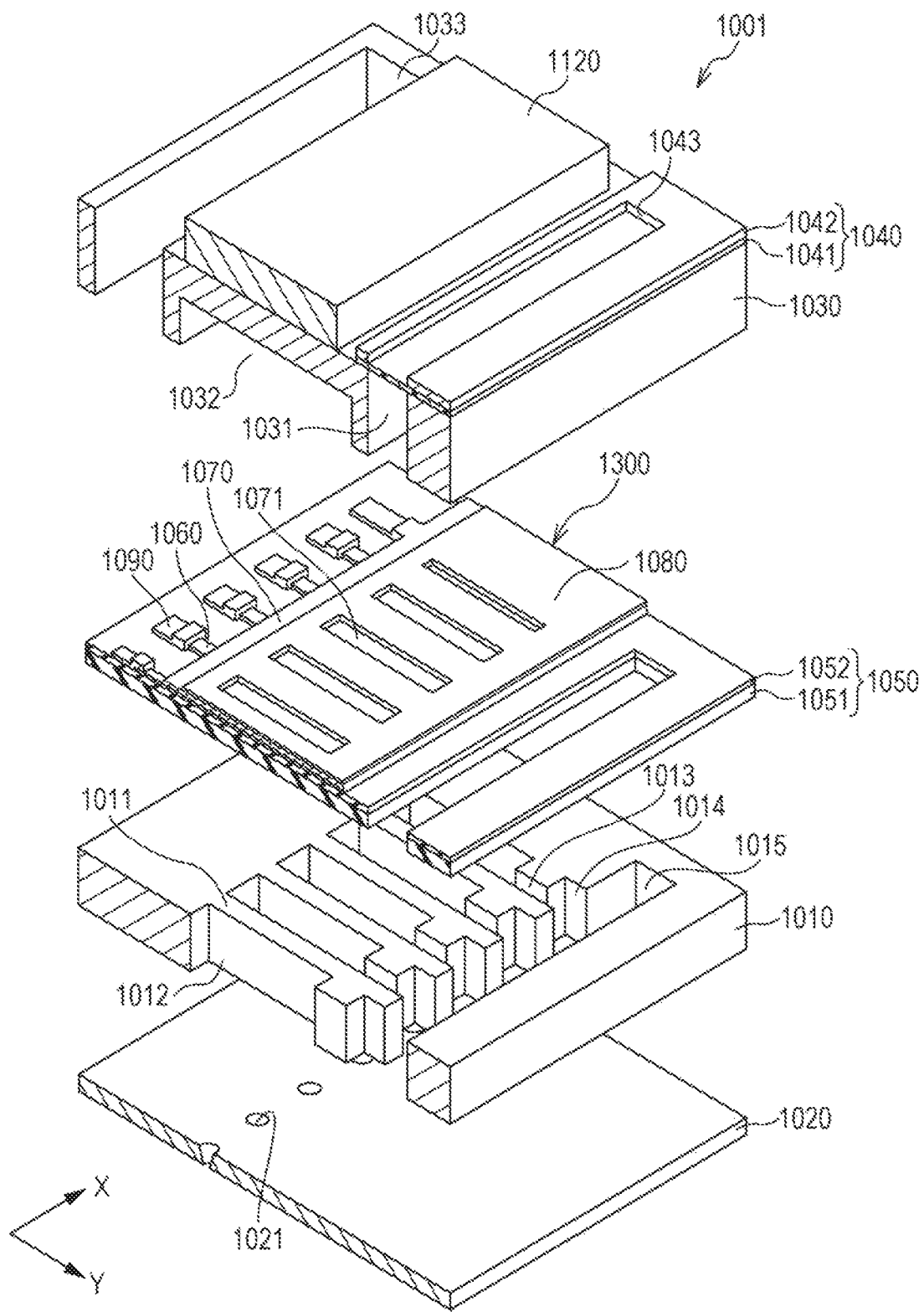
FIG. 10 is an exploded perspective view of a recording head.
Figure 11:
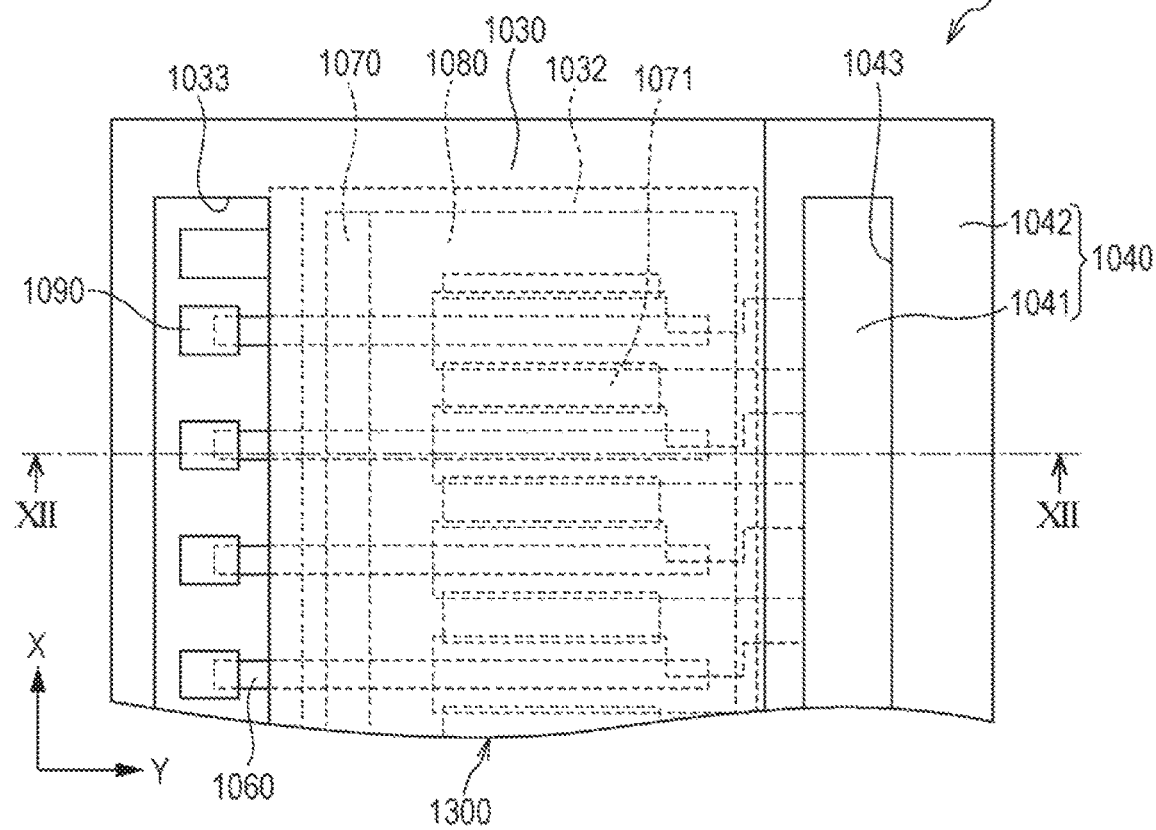
FIG. 11 is a plan view of the recording head.
Figure 12:
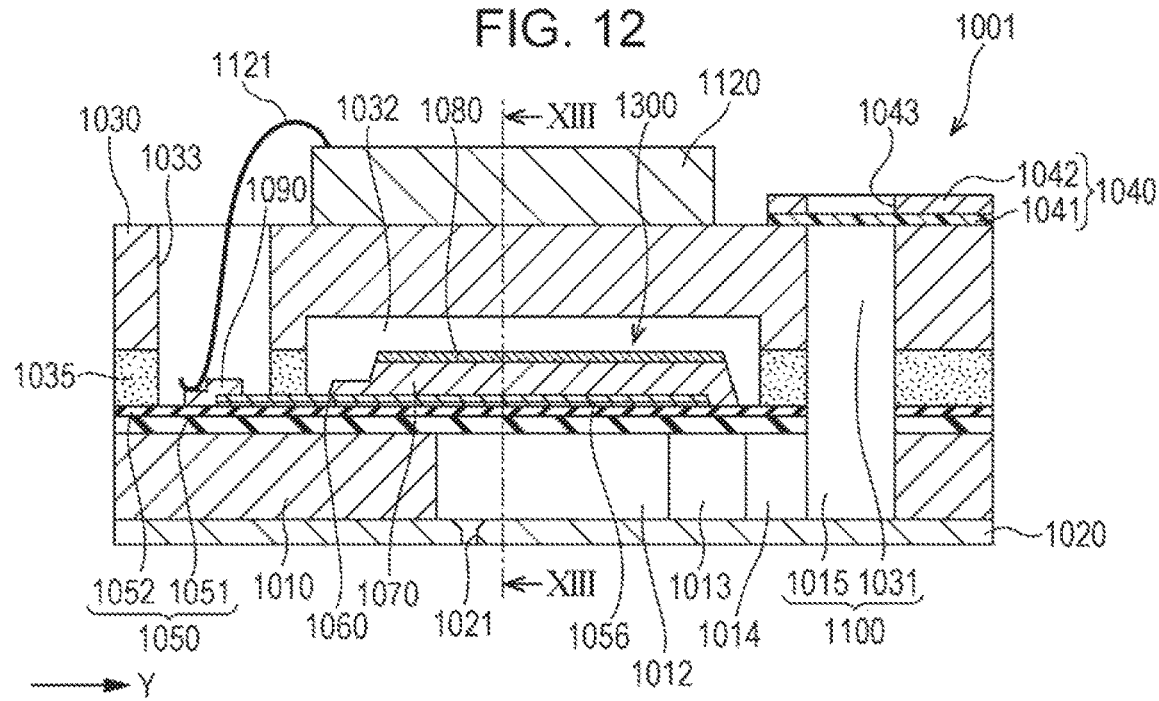
FIG. 12 is a cross-sectional view taken along the line XII-XII of FIG. 11.
Figure 13:
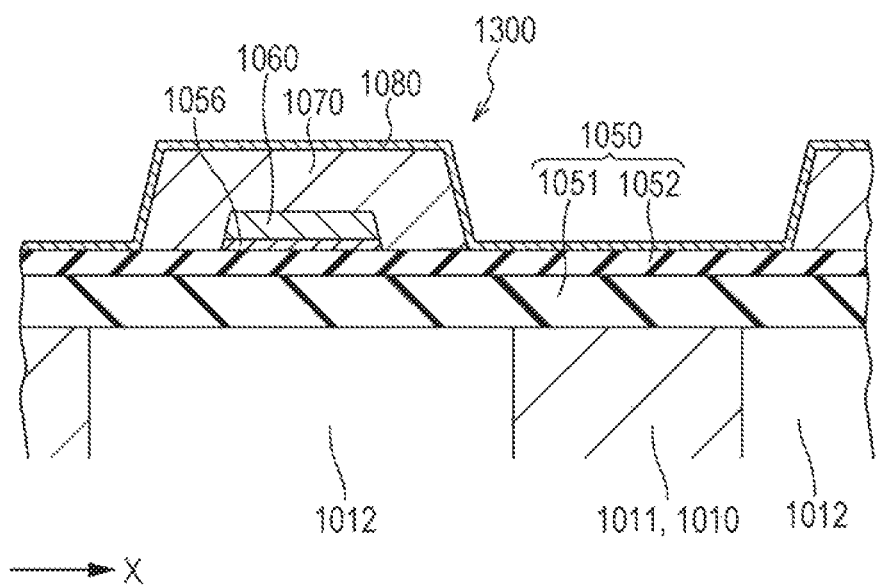
FIG. 13 is an enlarged cross-sectional view taken along the line XIII-XIII of FIG. 12.

FIGS. 10 to 13 each show one example of an ink jet type recording head (hereinafter, referred to as "recording head") to be mounted in a liquid jetting device, such as an ink jet type recording device. FIG. 10 is an exploded perspective view of a recording head which is one example of a liquid jetting head according to this embodiment, FIG. 11 is a plan view of a flow path forming substrate at a piezoelectric element side, FIG. 12 is a cross-sectional view taken along the line XII-XII of FIG. 11, and FIG. 13 is an enlarged cross-sectional view of an important portion of a piezoelectric element.

A flow path forming substrate 1010 is formed, for example, of a silicon single crystal substrate, and pressure generation chambers 1012 are formed therein. In addition, the pressure generation chambers 1012 defined by a plurality of partitions 1011 are arranged side by side in a direction in which nozzle openings 1021 ejecting the same color ink are arranged side by side. Hereinafter, the direction in which the pressure generation chambers 1012 are arranged side by side in the flow path forming substrate 1010 is called a width direction or a first direction X, and the direction orthogonal to the first direction X is called a second direction Y. In addition, in this embodiment, the direction intersecting both the first direction X and the second direction Y is called a third direction Z. In addition, in this embodiment, although the directions (X,Y,Z) are orthogonal to each other, the arrangement relationship between constituents is not always limited to an orthogonal relationship.

At one end side of the pressure generation chamber 1012 of the flow path forming substrate 1010 in the second direction Y, an ink supply path 1013, the opening area of which is decreased by squeezing one side of the pressure generation chamber 1012 in the first direction X, and a communication path 1014 having an approximately the same width as that of the pressure generation chamber 1012 in the first direction X are defined by the plurality of partitions 1011. At the outside (opposite to the pressure generation chamber 1012 in the second direction Y) of the communication path 1014, a communication portion 1015 forming a part of a manifold to be used as a common ink chamber for each pressure generation chamber 1012 is formed. That is, in the flow path forming substrate 1010, a liquid flow path is formed from the pressure generation chambers 1012, the ink supply paths 1013, the communication paths 1014, and the communication portion 1015.

To one end surface side of the flow path forming substrate 1010, that is, to the surface in which the liquid flow paths, such as the pressure generation chambers 1012, are opened, a nozzle plate 1020 in which nozzle openings 1021 communicating with the pressure generation chambers 1012 are formed is bonded, for example, with an adhesive or a thermal melting film. In the nozzle plate 1020, the nozzle openings 1021 are arranged side by side in the first direction X. In addition, on the other surface side of the flow path forming substrate 1010 facing the above one end surface side, there is provided a vibrating plate 1050 composed of an elastic film 1051 formed of $SiO_2$ (silicon dioxide) or the like and an insulating film 1052 formed of $ZrO_2$ (zirconium oxide) or the like. The vibrating plate 1050 described above may be formed to have a thickness similar to that described in the above embodiment. In addition, as is the embodiment 1, instead of $ZrO_2$ which is the second layer, a ceramic having a Young's modulus larger than that of $SiO_2$ may be used.

On the insulating film 1052, a piezoelectric element 1300 including a first electrode 1060, a piezoelectric layer 1070, and a second electrode 1080 is formed with an adhesion layer 1056 provided therebetween. The piezoelectric element 1300 described above is similar to the above piezoelectric element 300, and detailed description thereof will be omitted.

Onto the flow path forming substrate 1010 on which the piezoelectric elements 1300 are formed as described above, a protective substrate 1030 is bonded with an adhesive 1035. The protective substrate 1030 has a manifold portion 1031. By the manifold portion 1031, at least a part of a manifold 1100 is formed. The manifold portion 1031 of this embodiment penetrates the protective substrate 1030 in the third direction Z, that is, in the thickness direction and is further formed along the first direction X, that is, along the width direction of the pressure generation chamber 1012. In addition, the manifold portion 1031 communicates with the communication portion 1015 of the flow path forming substrate 1010 as described above. By the composition described above, the manifold 1100 functioning as a common ink chamber of the pressure generation chambers 1012 is formed.

In the protective substrate 1030, a piezoelectric element holding portion 1032 is formed in a region including the piezoelectric element 1300. The piezoelectric element holding portion 1032 has a space so as not to disturb the movement of the piezoelectric element 1300. This space may be either sealed or not sealed. In the protective substrate 1030, a through-hole 1033 penetrating the protective substrate 1030 in the third direction Z, that is, in the thickness direction, is provided, and in the through-hole 1033, one end portion of a lead electrode 1090 is exposed.

Onto the protective substrate 1030, a drive circuit 1120 functioning as a signal processing portion is fixed. As the drive circuit 1120, for example, a circuit substrate or a semiconductor integrated circuit (IC) may be used. The drive circuit 1120 and the lead electrode 1090 are electrically connected to each other with a connection wire 1121 provided therebetween. The drive circuit 1120 may be electrically connected to a printer controller 1200. The drive circuit 1120 as described above functions as a control device of this embodiment.

Onto the protective substrate 1030, a compliance substrate 1040 formed of a sealing film 1041 and a fixing plate 1042 is bonded. A region of the fixing plate 1042 facing the manifold 1100 is completely removed in the third direction Z, that is, in the thickness direction, so that an opening portion 1043 is formed. One surface (at a +Z direction side) of the manifold 1100 is sealed only by the flexible sealing film 1041.

In the liquid jetting head as described above, in order to improve the displacement efficiency, the vibrating plate structure of the invention may also be used.

Another Embodiment

Heretofore, although the piezoelectric element application device of the invention has been described with reference to the ultrasonic sensor and the liquid jetting head by way of example, the fundamental composition of the invention is not limited to those described above. For example, in the above embodiments 1 and 2, although the silicon single crystal substrate has been described as one example of the substrate, the substrate is not limited thereto, and for example, an SOI substrate or a material such as a glass may also be used.

In the above embodiment 2, as one example of the liquid jetting head, although the ink jet recording head has been described, the invention may be widely applied to the whole liquid jetting heads and may also be applied to liquid jetting heads each jetting a liquid other than ink. As the other liquid jetting heads, for example, there may be mentioned various types of recording heads used for image recording devices, such as a printer; color material jetting heads used for manufacturing of color filters of liquid crystal displays; electrode material jetting heads used for electrode formation of organic EL displays and field emission displays (FEDs); and bioorganic material jetting heads used for manufacturing of biochips.

In addition, the invention may be applied not only to an ultrasonic sensor and a liquid jetting head but also to a piezoelectric element to be mounted in another piezoelectric element application device. As one example of the piezoelectric element application device, for example, an ultrasonic device, a motor, a pressure sensor, a pyroelectric element, and a ferroelectric element may be mentioned. In addition, completed products using the piezoelectric element application devices described above, such as a jetting device for jetting a liquid or the like using the above liquid jetting head, an ultrasonic sensor using the above ultrasonic device, a robot using the above motor as a drive source, an IR sensor using the above pyroelectric element, and a ferroelectric memory using the above ferroelectric element, may also be included in the piezoelectric element application devices.

The constituent elements shown in the drawings, that is, for example, the thickness, the width, and the relative positional relationship of the layer may be exaggerated in some cases in order to facilitate the understanding of the invention. In addition, the word "on" of the present specification is not limited to "directly on" in terms of the positional relationship between the constituent elements. For example, the expression, such as "first electrode on the substrate" or "piezoelectric layer on the first electrode" does not exclude the case in which between the substrate and the first electrode or between the first electrode and the piezoelectric layer, another constituent element is provided.

The entire disclosure of Japanese Patent Application No. 2015-249097, filed Dec. 21, 2015 is expressly incorporated by reference herein.

What is claimed is:

1. A piezoelectric sensor comprising:
a substrate;
a vibrating plate provided on the substrate;
a lower electrode provided on the vibrating plate;
a piezoelectric layer provided on the lower electrode; and
an upper electrode provided on the piezoelectric layer,
wherein the vibrating plate is configured with a first layer made of $SiO_2$, and a second layer made of ceramic,
the first layer is provided at a side of the substrate, and the second layer is provided at a side of the piezoelectric layer,
a Young's modulus of the second layer is larger than a Young's modulus of the first layer,
when the Young's modulus of the first layer is $E_{v1}$, a thickness thereof is $d_{v1}$, the Young's modulus of the second layer is $E_{v2}$, and a thickness thereof is $D_{v2}$, Expression (1) is constant, $$E_{v1} \times d_{v1}{}^2 + E_{v2} \times d_{v2}{}^2 \qquad (1), \text{ and}$$

when a minimum value of Expression (3) is $f_{min}$, $f_{min} \leq f(d_{v1}, d_{v2}) \leq 1.02 f_{min}$ is satisfied, $$f(d_{v1}, d_{v2}) = E_{v1} d_{v1}{}^3 + E_{v2} d_{v2}{}^3 / E_{v2} (d_{v1} + d_{v2})^3 \qquad (3).$$

2. The vibrating plate structure according to claim 1, wherein the thickness of the first layer is 200 nm or more.

3. The vibrating plate structure according to claim 1, wherein the ceramic forming the second layer is at least one type selected from the group consisting of zirconium oxide, aluminum oxide, silicon nitride, and silicon carbide.

4. A piezoelectric element application device comprising: the vibrating plate structure according to claim 1, and the piezoelectric element provided on the vibrating plate.

5. A piezoelectric element application device comprising: the vibrating plate structure according to claim 2, and the piezoelectric element provided on the vibrating plate.

6. A piezoelectric element application device comprising: the vibrating plate structure according to claim 3, and the piezoelectric element provided on the vibrating plate.

7. A vibrating plate structure comprising:
a vibrating plate provided between a substrate and a piezoelectric element formed of a pair of electrodes and a piezoelectric layer provided therebetween,
wherein the vibrating plate includes a first layer which is formed of a silicon oxide film and which is provided at a substrate side; and a second layer which is formed of a ceramic having a Young's modulus larger than that of the silicon oxide, and
wherein the ceramic forming the second layer is at least one type selected from the group consisting of aluminum oxide and silicon carbide.

8. The vibrating plate structure according to claim 7, wherein the thickness of the first layer is 200 nm or more.

9. A piezoelectric element application device comprising: the vibrating plate structure according to claim 7, and the piezoelectric element provided on the vibrating plate.

10. A piezoelectric element application device comprising:
the vibrating plate structure according to claim 8, and the piezoelectric element provided on the vibrating plate.

* * * * *